United States Patent [19]

Ambros et al.

[11] Patent Number: 4,722,765

[45] Date of Patent: Feb. 2, 1988

[54] PROCESS FOR PREPARING PRINTED CIRCUITS

[75] Inventors: Peter Ambros, Leutershausen; Walter Budig, Wulfershausen; Gisela Westermeir, Hohenroth, all of Fed. Rep. of Germany

[73] Assignee: Preh Elektrofeinmechanische Werke Jakob Preh Nachf. GMBH & Co., Bad Neustadt/Saale, Fed. Rep. of Germany

[21] Appl. No.: 946,115

[22] Filed: Dec. 23, 1986

Related U.S. Application Data

[63] Continuation of Ser. No. 621,723, Jun. 18, 1984, abandoned.

[30] Foreign Application Priority Data

Jun. 22, 1983 [DE] Fed. Rep. of Germany ....... 3322382

[51] Int. Cl.⁴ .................. B44C 1/22; C03C 15/00; C03C 25/06
[52] U.S. Cl. .................................... 156/630; 156/233; 156/249; 156/631; 156/633; 156/655; 156/667; 156/902; 29/846; 174/68.5; 428/601; 428/632; 428/674
[58] Field of Search ............... 156/150, 151, 233, 247, 156/630, 631, 633, 634, 652, 655, 656, 667, 901, 902, 249, 325; 204/11, 15, 281; 428/601, 607, 631, 632, 674; 29/846; 174/68.5

[56] References Cited

U.S. PATENT DOCUMENTS

| | | | |
|---|---|---|---|
| 3,181,986 | 5/1965 | Pritikin ................................ | 156/233 |
| 3,324,014 | 6/1967 | Modjeska ...................... | 156/150 X |
| 3,984,598 | 10/1976 | Sarazin et al. .................. | 156/233 X |
| 4,357,395 | 11/1982 | Lifshin et al. ................... | 156/233 X |
| 4,383,003 | 5/1983 | Lifshin et al. ................... | 428/674 X |
| 4,394,419 | 7/1983 | Konicek .......................... | 428/674 X |
| 4,431,710 | 2/1984 | Lifshin et al. ................... | 428/632 X |

FOREIGN PATENT DOCUMENTS

| | | |
|---|---|---|
| 0738414 | 8/1943 | Fed. Rep. of Germany . |
| 3031751 | 4/1982 | Fed. Rep. of Germany . |
| 3131688 | 5/1982 | Fed. Rep. of Germany . |
| 3135554 | 4/1983 | Fed. Rep. of Germany . |

*Primary Examiner*—William A. Powell
*Attorney, Agent, or Firm*—Woodcock, Washburn, Kurtz, Mackiewicz & Norris

[57] ABSTRACT

The present invention describes an improved reverse lamination process for preparing printed circuits with resistors, conductor strips and/or contacts integrated in the circuit. A separating layer is applied on a metallic intermediate carrier. The intermediate carrier thus coated is then printed with a conductive paste in a desired mirror-inverted layout to provide the resistors, conductor strips and/or contacts. This is followed by the lamination which is carried out under temperature effect and under pressure, the thus laminated package comprising the intermediate carrier, an intermediate layer and the final substrate. The intermediate carrier is subsequently removed, and the separating layer is etched off. The separating layer acts as a parting agent to permit easy mechanical separation and reuse of the metallic intermediate carrier.

16 Claims, 4 Drawing Figures

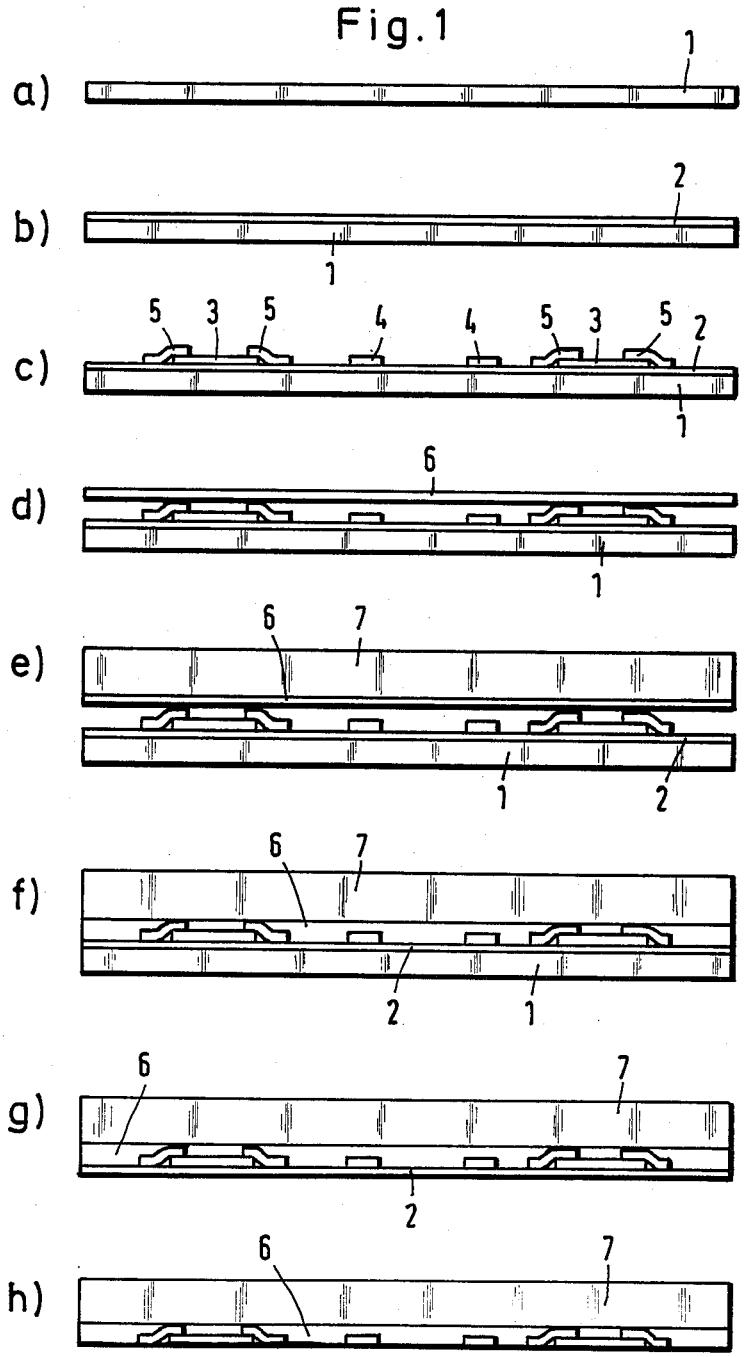

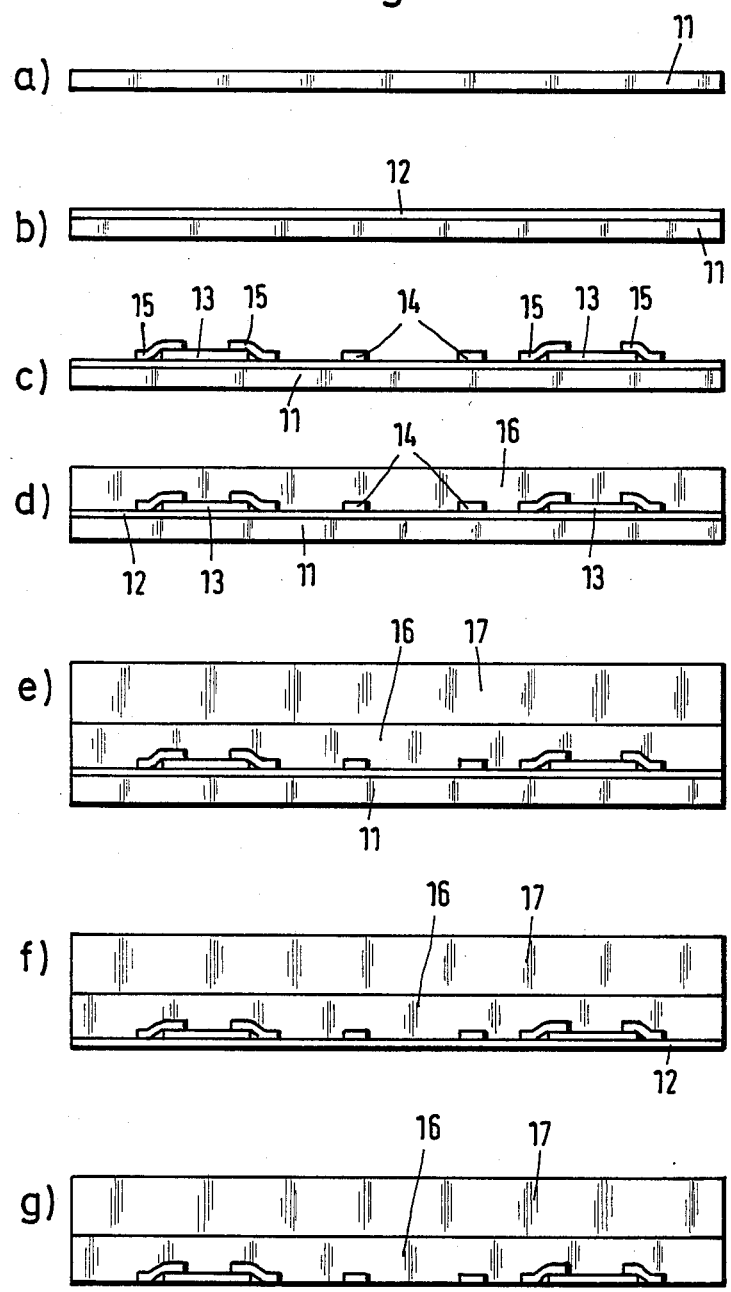

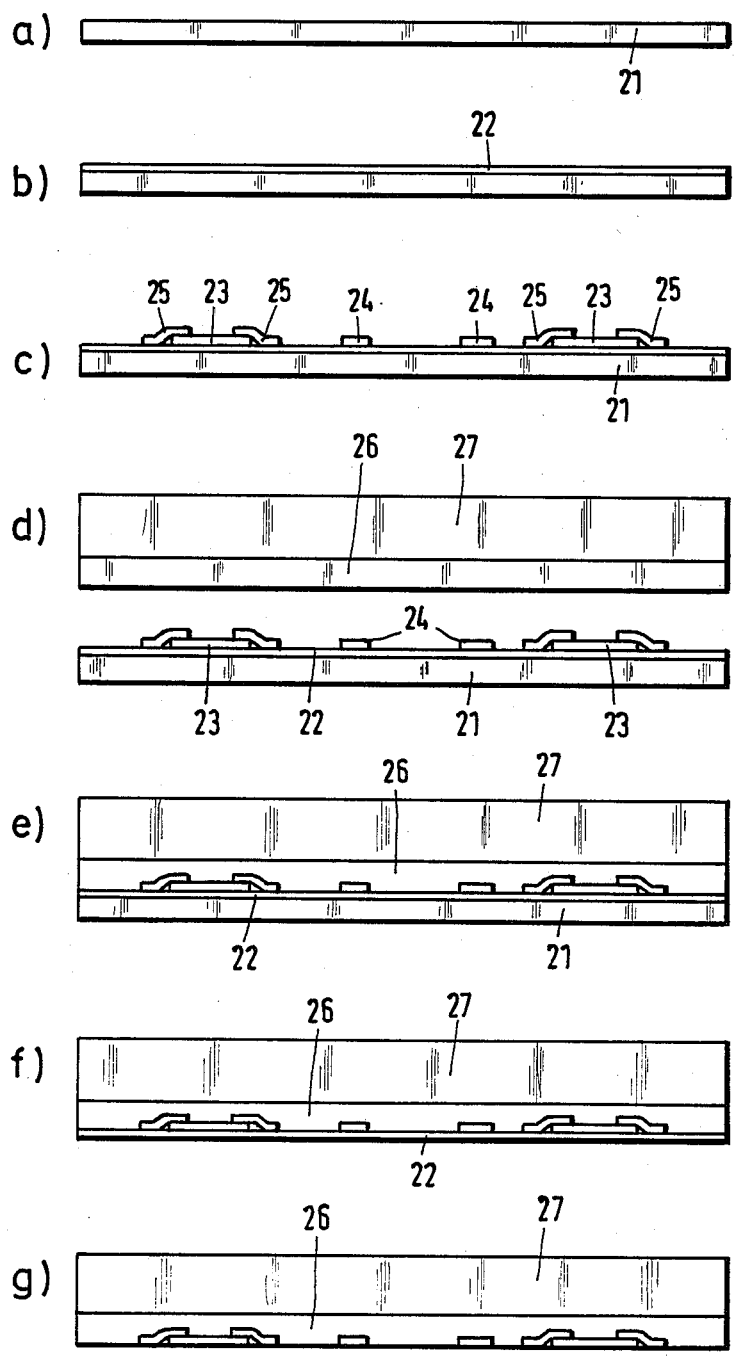

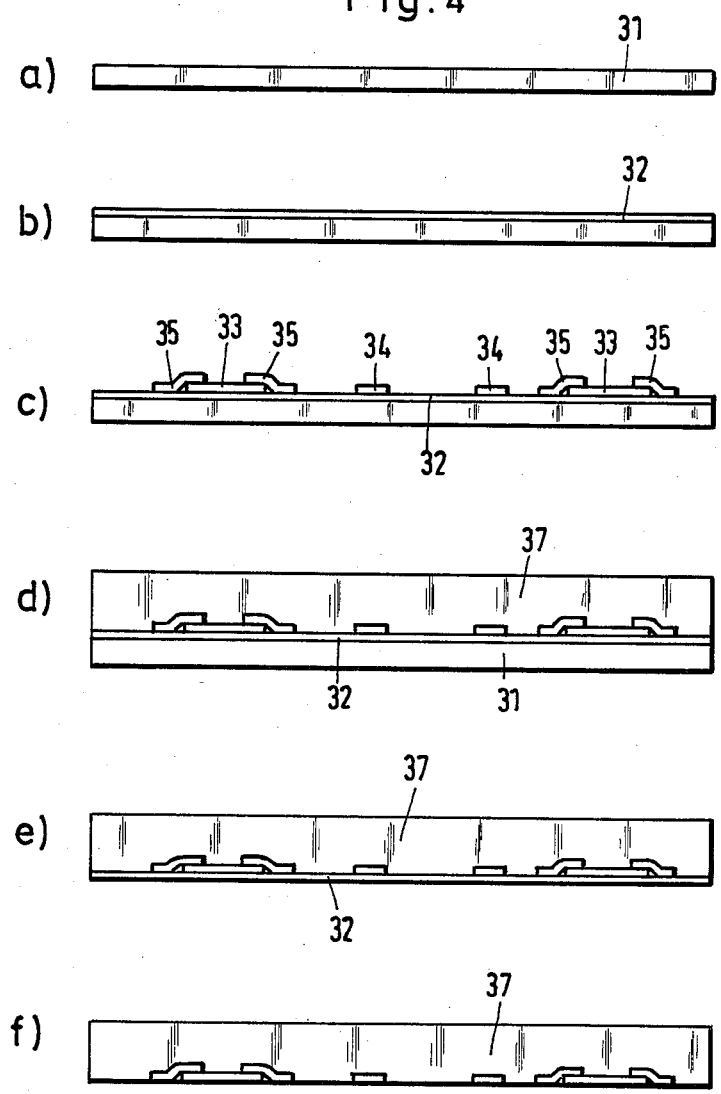

PROCESS FOR PREPARING PRINTED CIRCUITS

This is a continuation, of application Ser. No. 621,723, filed June 18, 1984, now abandoned.

BACKGROUND OF THE INVENTION

1. Field of the Invention

The present invention pertains to a process for preparing printed circuits, and in particular a process for preparing a laminated printed circuit.

2. Description of the Prior Art

Printed circuits and their modifications, ranging from simple printed and etched plates to flexible circuit boards to multilevel circuit boards, are an integral part of modern technology. They consist, in principle, of a base plate or carrier plate made of an electrically insulating material on which conductor strips made of an electrically conducting, metallic material are applied according to a desired lay-out. The conductor strips can be located in different planes, and they are connected with each other by so-called pass through or through-hole plates. Various processes are available for preparing the conductor strips; the most important of these are the additive process, the subtractive process, and the semiadditive process. It is a common feature of all processes that the conductor strips ultimately lie raised on the substrate. In the case of the application of printed circuits, e.g., for switches or potentiometers, this is bothersome, because the slide contact has to steadily clear differences in height, which results in more rapid wear. There has therefore been an increased tendency to embed the conductor strips, resistor strips and the like into the substrate by the so-called reverse lamination technique.

The principle of the reverse lamination technique is already known from DE-PS [West German Patent] No. 738,414. It was observed during the preparation of resistor layers that the conductor particles in the still liquid layer become deposited preferably in the substrate under the effect of gravity before hardening, while the surface has a reduced concentration of conductor particles. The resistivity and also the current distribution are consequently not uniform over the entire cross section. This affects the noise characteristics of the resistor layer if it is used in a potentiometer. Attempts have now been made to find a resistor layer in which the highest density of the conductor particles occurs immediately on the surface, and in which the density decreases in the direction of depth. It has been proposed that this be achieved by applying the resistor mass in liquid state first on a temporary substrate, the intermediate carrier. Under the effect of gravity the conductor particles sink down to the side of the substrate. After the hardening of the resistor mass the layer is lifted off from the intermediate carrier, and atttached on the final carrier with the side which has a lower content of conductor particles. A body with a surface polished to a high gloss, e.g., glass, is used as the intermediate carrier. The surface properties of the layer resistor are also dependent on the roughness of this surface. This known process is also recommended when several resistor layers are to be applied one on top of the other. Mechanical operations are eliminated in this process. If the layer thickness is great enough and the duration of settling is long enough, the density of the conductor particles decreases so strongly that this side acts as an insulator. It is now possible to take a metal plate which has a favorable heat conduction as the final substrate.

A reverse lamination process is described in DE-OS [West German Offenlegungsschrift] No. 30 31 751, in which a metal foil consisting of an etchable material, e.g., aluminum or copper, is used as the intermediate carrier. The intermediate carrier can also be a plastic film or it can consist of anodized aluminum or of glass. That side of the intermediate carrier on which the resistor mass is to be applied must be polished to a high gloss in this case as well. After the resistor mass is applied by a screen printing technique in the desired lay-out, hardening is carried out. The conductive layer is transferred onto the final substrate directly or by means of an intermediate adhesive layer. After transfer the intermediate carrier is removed by etching or dissolution of the intermediate carrier in water, or by lifting off in the case of glass. In order to guarantee a continuous movement of the slide contact, the space between the resistor layer and the corresponding conductor strips is filled out with a binder after hardening of the resistor layer.

Another process for preparing copper-lined laminates by the use of the reverse lamination technique is known from DE-OS No. 31 31 688. An aluminum carrier plate is coated with a substance acting as a parting agent, which has a tendency to form a relatively weak bond with copper. Silicon dioxide, silicon oxide or soda-lime window glass are used as substances. The coating is carried out by spraying, by chemical vapor deposition, or by electron beam sputtering techniques. After coating of the aluminum carrier plate with this substance, a copper coating is applied by spraying or another vapor deposition technique. The copper layer is subsequently subjected to an electrolytic treatment to form a roughened surface. This surface is then flash-coded with zinc galvanically. The lamination step is carried out by pressing of the carrier plate thus treated with a glass-epoxy-preimpregnated web material. The carrier plate is subsequently removed by stripping off mechanically. The parting agent remains on the carrier plate, so that the metal surface of the laminate becomes exposed.

Another process for preparing printed circuits which contain integrated electrical resistors, contacts and corresponding conductor strips, is described in DE-OS No. 31 35 554. The reverse lamination technique is used in this case as well, and the resistors, contacts and the conductor strips are applied on an intermediate carrier in the desired lay-out. This is followed by hardening. The object is then laminated onto a substrate with the coated side by using an epoxy resin adhesive. The intermediate carrier is finally removed by etching in a final process step.

SUMMARY OF THE INVENTION

It is an object of the present invention to provide a process for preparing printed circuits by a reverse lamination technique in which the intermediate carrier can be easily removed from the substrate mechanically without etching, and thus can be reused.

In accordance with the above object, there is disclosed a reverse lamination method of producing a printed circuit, the circuit having elements such as electrical resistors, conductor strips and/or connectors integrated into it, the method comprising the steps of polishing an intermediate carrier and then preparing a separating layer on the coating side thereof, the separating layer suitably being a metal oxide removable by etching, printing the coated intermediate carrier with electrical elements using a resistor mass consisting of an organic binder with a filler dispersed in it, said printing being done in a desired mirror-inverted layout, then drying said printed and coated carrier and heat treating it, laminating said heat treated carrier onto a substrate comprising an intermediate layer, removing the intermediate carrier which can be reused, and then etching off said separating layer to form the reverse laminated printed circuit.

BRIEF DESCRIPTION OF THE DRAWINGS

FIG. 1 illustrates, in steps shown in a-h, the different stages of preparation of a printed circuit with integrated passive members by the reverse lamination process of this invention.

FIG. 2 illustrates, in a-g, another embodiment of the preparation process of this invention.

FIG. 3 illustrates, in a-g, yet another embodiment of the preparation process of this invention.

FIG. 4 illustrates, in a-g, a still further embodiment of the preparation process of this invention.

DESCRIPTION OF THE PREFERRED EMBODIMENTS

A mode of preparation of a printed circuit in accordance with this invention is described with reference to FIG. 1. An intermediate carrier 1 made of metal is used. Copper, zinc, iron, chromium, nickel and/or their alloys are preferred metals for this use. This intermediate carrier preferably has a high-gloss polished surface. After polishing it is washed and then dried. A thin metal oxide layer 2 serving as a separating layer is then formed on the carrier surface in an oven, where the metal carrier is subjected to a temperature selected to produce this effect. The oxide layer is formed from the metal of the intermediate carrier under the effect of oxygen. It is also of significance that the oxide layer can be etched off with an easily handled acid, e.g., sodium persulfate. A preferred range of oven temperature is $250° \pm 10°$ C., at which temperature a thin oxide layer 2 forms in about half an hour. This temperature/time ratio has proved to be favorable for economic reasons. A lower temperature may also be suitably used, but requires a correspondingly longer hold time in the oven.

A mirror-inverted lay-out is printed on the intermediate carrier 1 provided with the oxide layer 2 by the screen printing technique, using one or possibly several resistor pastes of suitable electrical conductivity. The resistor pastes consist usually of a binder, e.g., a melamine-formaldehyde and/or an alkyd resin, with a filler consisting of electrically conductive particles dispersed in it, which particles advantageously have a size of $<5$ $\mu$ (microns). Graphite and/or carbon black and/or silver and/or nickel particles can be used as electrically conducting particles. So-called pyropolymers may also be used, comprising refractory particles, e.g., alumina, silicon oxide, titanium oxide, iron oxide or their mixtures or metal alloys, which are coated with carbon. The resistor layers are hardened under temperature effect. The hardening temperature and the hardening time are practically freely selectable, so that they can be optimally adapted to the actual coating.

According to FIG. 1c the resistor layers, which are designated by 3, are printed with connection areas or contacts 5 with an overlapping electrically conductive silver paste. The resistor layers can also be used as fixed resistors, potentiometer resistor layers, and as contacts for keyboards. Conductor strips 4 are also prepared advantageously from the same silver paste, or equivalent material.

As is apparent from FIG. 1d, a prepreg film 6, suitably an epoxy resin-impregnated polyester nonwoven material, is placed on the intermediate carrier 1 thus coated. As seen in FIG. 1e, the final substrate 7, which suitably consists of a pressed laminate, a duroplast or the like, is placed over film 6. It is also possible to use a metal plate for substrate 7, in which case the prepreg film is thicker, so that there is still an insulating layer of sufficient thickness in finished state between the highest point of the coated intermediate carrier and the substrate.

The package shown in FIG. 1e is laminated under temperature effect under pressure. The temperature is 100° to 200° C., preferably 120° C. The pressure is 1 to 5 $N/mm^2$, preferably 1.5 $N/mm^2$. The lamination is carried out within a time of 20 minutes to 3 hours. The heated and therefore flowable material of the prepreg film 6 fills the spaces between the resistor layers and the conductor strips or, if necessary, further elevations on the intermediate layer during the lamination. The item thus obtained is shown in FIG. 1f.

After the lamination process the intermediate carrier 1 is stripped off mechanically, as shown in FIG. 1(g), and is available for reuse. The remaining oxide layer 2, which is a separating layer acting as a parting agent, is etched off subsequently. After the thin oxide film has been etched off, the final surface of the printed circuit is exposed. This surface layer is extremely smooth and shows no grades, even if several overlapping layers have been applied. Only one coating process is shown in FIG. 1c. It is, of course, also within the scope of the invention to apply several layers with insulating layers and feedthroughs between them.

The previous surface has been sunk by the reverse lamination process into the new, now final substrate. The resistor layers and the conductor strips are firmly anchored into this final substrate. They are protected, e.g., from moisture effects, not only from the bottom, but also on the sides.

A modified embodiment of the present invention will be explained below on the basis of FIG. 2, whose components, FIGS. 2a through 2g, illustrate different stages of the printed circuit production process. The process steps 2a through 2c correspond to the steps 1a through 1c in FIG. 1. The intermediate carrier is designated by 11. The metal oxide layer is designated by 12. The resistor layer 13, the connection areas 15 and the conductor strips 14 are applied on the intermediate carrier provided with the metal oxide, preferably by the screen printing process. A laminating resin 16 is poured over the coated and hardened intermediate carrier in the process step illustrated in FIG. 2d, whereby the spaces between the resistor layers, the connection areas and the conductor strips are filled in. An epoxy, phenol, or polyester resin or mixtures thereof are used preferably as laminating resin. Thus, an intermediate layer is formed after hardening, which is designated by 16 in FIG. 2. The final substrate 17 is placed over the object as shown in FIG. 2e, pressed in accordance with the above described lamination process. The subsequent process steps 2f through 2g, concerning the separation of the intermediate carrier and the removal of the metal oxide layer, correspond to the steps 1g and 1h of FIG. 1.

Another modification of the production process is shown in FIG. 3. Contrary to the process according to FIG. 2, in this embodiment the laminating resin is poured over the final substrate rather than on the coated intermediate carrier, as illustrated in FIG. 3d. The other process steps correspond to the steps already described. The reference numbers have also been selected accordingly. Thus, 21 represents the intermediate carrier and 22 the metal oxide layer; the coating consists of the resistor layer 23, the connection areas 25 and the conductor strips 24; the intermediate layer which consists of laminating resin has the reference number 26; and the final substrate is designated by 27.

Another embodiment of the production process is illustrated in FIG. 4. The process steps 4a through 4c correspond to the steps of the prior described processes. According to FIG. 4d, the coated and hardened intermediate carrier 31 provided with the oxide layer 32 is covered by an intermediate layer which represents at the same time the final substrate 37, and which is prepared by pressing, injection molding or a transfer molding process. The material used for this is a duroplast, preferably a polyphenol and/or a polyester. The removal of the intermediate carrier and of the metal oxide layer according to FIGS. 4e through 4f is the same as already described in connection with the other processes, and the reference numbers have also been selected accordingly. The intermediate carrier is designated by 31; the metal oxide layer by 32; the coating consists of the resistor layer 33, the connection area 35 and the conductor strips 34; and the substrate is designated by 37. Note that there is no separate intermediate layer in this embodiment.

In FIGS. 1 through 4 the printed circuits are shown prepared only on one side of the substrate, for the sake of simplicity. However, it is also within the scope of this invention to build up electrical circuits, including multi-layer designs, on both sides of the substrate, in which case the circuits of the different planes or on the two sides of the substrate are connected with each other electrically i.e., functionally, by through-hole plates.

The integrated resistor layers, potentiometer layers or switch contacts are prepared simply by printing with a resistor paste of suitable conductivity. Different resistance values are obtained by corresponding geometric shape design. However, it is also possible to use different resistor pastes with different conductivities to achieve different resistance values as an alternative.

Several examples are presented below, which illustrate the process according to the present invention and the printed circuits produced thereby.

EXAMPLE 1

An intermediate carrier consisting of bronze plate, with a thickness of 0.5 mm, is polished to a high gloss in a polishing apparatus, and dried in a Freon apparatus. This intermediate carrier is subsequently provided with a thin oxide layer by maintaining it in an oven at a temperature of 250° C. for a time of half an hour.

In a subsequent operation the intermediate carrier is printed with a screen printing paste in the necessary layout by a screen printing technique, and hardened at 230° C. within one hour. The screen printing paste consists of melamine-formaldehyde and alkyd resin as binder, with refractory particles and with carbon-coated particles with a size of <5 μ dispersed in it at a ratio of one part by weight binder to one part by weight filler.

An FR-4 grade fiber glass laminate is brushed, washed, dried at 140° C. for three hours, and tempered.

A press package is then composed using two prepreg layers which consist of nonwoven polyester impregnated with a laminating resin based on epoxy resin, so that the following structure is formed:

first, a metallic intermediate carrier with a layer intended for reverse lamination;

second, a prepreg layer;

third, a fiber glass laminate of FR-4 grade; and fourth, another prepreg layer (intended only to prevent the substrate from bending).

This press package is then pressed in a multilayer press at 120° C. for 20 minutes and under a pressure of 1.5 N/mm². The pressed package is then separated, whereby the intermediate carrier is also removed. The layer, e.g., a resistor layer, has become laminated on the final fiber glass laminate carrier. A very thin oxide layer has remained on the surface of the resistor layer, and this oxide layer is removed by etching with sodium persulfate. The finished product is then cut to the final shape.

EXAMPLE 2

The process as in Example 1, with the difference that the final substrate is grade FR-3 laminated paper which is coated with a laminating resin based on epoxy in state B. The second prepreg layer is omitted.

EXAMPLE 3

The process as in Examples 1 and 2, wherein one side of the intermediate carrier is provided with a carbon black-filled resistor layer, and additionally has a layer of a laminating resin based on polyphenol in state B, and the final substrate is a laminated paper of grade FR-2.

EXAMPLE 4

An intermediate carrier as in Example 1 is placed into a mold of an injection-molding machine. The layer located on the intermediate carrier is sprayed with a polyester injection-molding compound, and this duroplastic mass forms the actual substrate.

EXAMPLE 5

An intermediate carrier as in Example 1 is placed into a mold of a transfer molding machine, and sprayed with a polyphenol mass, and this duroplastic mass forms the actual substrate.

EXAMPLE 6

An intermediate carrier as in Examples 1, 4 and 5, is placed into a mold of a duroplast press, and pressed with a prepolymerized diallylphthalate molding compound.

The processes according to the Examples 4, 5 and 6 are used preferably for preparing products of small dimensions, e.g., potentiometers, switches, etc.

We claim:

1. A reverse laminated process for producing printed circuits, said circuits having elements selected from electrical resistors, conductor strips and connectors integrated therein, characterized by the following process steps:

polishing a heat sensitive, copper alloy intermediate carrier to a high gloss on a given coating side;

preparing a metal oxide separating layer directly on said coating side of said intermediate carrier, said separating layer being removable by etching;

printing said separating layer of said coated intermediate carrier with said elements in a desired mirror-inverted lay-out and then drying same;

subjecting said coated, printed and dried intermediate carrier to heat treatment at an elevated temperature to cure said lay-out;

laminating said heat treated carrier onto a substrate;

removing only said intermediate carrier from said oxide separating layer, said oxide separating layer remaining affixed to said substrate and said intermediate carrier removed in a condition suitable for reuse in the same process; and etching off said oxide separating layer from said substrate after said intermediate carrier has been removed to form a laminated printed circuit.

2. The process according to claim 1, comprising cleaning, washing and then drying said polished intermediate carrier before preparing said separating layer, and further characterized in that said drying of said intermediate carrier is carried out in a Freon apparatus.

3. The process according to claim 1, characterized in that said step of preparing a separating layer comprises exposing said intermediate carrier to the effect of oxygen to form the metal oxide separating layer.

4. The process according to claim 3, characterized by preparing said metal oxide separating layer at a temperature of 250° C.±10° C. in about half an hour.

5. The process according to claim 1, characterized by forming said elements from a resistor paste consisting of an organic binder with a filler dispersed in it.

6. The process according to claim 5, characterized in that the binder is a melamine-formaldehyde and/or alkyd resin.

7. The process according to claim 5, characterized in that the filler consists of graphite and/or carbon black and/or silver and/or nickel particles and/or of refractory particles coated with carbon with a size of $<5\mu$.

8. The process according to claim 3 wherein said step of preparing a separating layer comprises the step of oxidizing a surface of said intermediate carrier to form a metal oxide separating layer of said metallic composition directly on said surface.

9. The process according to claim 1, characterized by preparing on said substrate a prepeg film prepared from an epoxy resin-coated nonwoven material or fabric.

10. The process according to claim 1, characterized in that said laminating is carried out at a temperature within the range of 100° to 200° C. and preferably at about 120° C., and under a pressure within the range of 1 to 5 $N/mm^2$ and preferably about 1.5 $N/mm^2$, for within a time of 20 minutes to 3 hours.

11. The process according to claim 1, characterized by the step of applying an intermediate layer on said coated intermediate carrier.

12. The process according to claim 11, characterized by forming said intermediate layer of a laminating resin which is selected from epoxy, phenol, polyester resin or a mixture thereof.

13. The process according to claim 1, characterized in that said substrate is an insulating material or a metal plate electrically insulated by an intermediate layer.

14. The process according to claim 11 characterized in that said intermediate layer and said substrate are one substrate element.

15. The process according to claim 14, characterized in that said substrate is a duroplast, preferably a polyphenol or a polyester.

16. A process of preparing a reverse laminated printed circuit, comprising the steps of: preparing a metal oxide separating layer directly on a monolithic, copper alloy composition intermediate carrier, printing resistive type circuit elements directly on said separating layer, laminating a resinous substrate onto said separating layer so as to envelope said elements except where they adjoin said separating layer, removing only said intermediate carrier from said separating layer, said separating layer remaining affixed to said substrate so that said intermediate carrier can be reused in carrying out the same process, and etching away said separating layer from said resinous substrate.

* * * * *